United States Patent
Yamagiwa

(10) Patent No.: US 11,721,407 B2
(45) Date of Patent: Aug. 8, 2023

(54) BIST FOR PERFORMING PARALLEL AND SERIAL TEST ON MEMORIES

(71) Applicant: Kioxia Corporation, Tokyo (JP)

(72) Inventor: Takashi Yamagiwa, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/463,937

(22) Filed: Sep. 1, 2021

(65) Prior Publication Data

US 2022/0246228 A1    Aug. 4, 2022

(30) Foreign Application Priority Data

Feb. 3, 2021  (JP) .................................. 2021-015745
Jul. 2, 2021  (JP) .................................. 2021-110627

(51) Int. Cl.
| | | |
|---|---|---|
| G11C 29/14 | (2006.01) | |
| G11C 29/12 | (2006.01) | |
| G11C 5/14 | (2006.01) | |
| G11C 11/4078 | (2006.01) | |
| G11C 11/4097 | (2006.01) | |

(52) U.S. Cl.
CPC ................ *G11C 29/14* (2013.01); *G11C 5/14* (2013.01); *G11C 11/4078* (2013.01); *G11C 11/4097* (2013.01); *G11C 29/12015* (2013.01)

(58) Field of Classification Search
CPC ....... G11C 29/14; G11C 5/14; G11C 11/4078; G11C 11/4097; G11C 29/12015
See application file for complete search history.

(56) References Cited

U.S. PATENT DOCUMENTS

| | | | |
|---|---|---|---|
| 7,734,975 B2 | 6/2010 | Anzou et al. | |
| 8,358,549 B2 | 1/2013 | Tomiyama | |
| 8,421,494 B2* | 4/2013 | Balog ................. | G01R 31/3172 |
| | | | 324/762.02 |
| 8,599,632 B2* | 12/2013 | Anzou ................... | G11C 29/26 |
| | | | 365/201 |
| 9,557,379 B2* | 1/2017 | Tokunaga .......... | G01R 31/3177 |
| 2002/0194558 A1 | 12/2002 | Wang et al. | |
| 2013/0326294 A1 | 12/2013 | Lo et al. | |

FOREIGN PATENT DOCUMENTS

| | | |
|---|---|---|
| JP | 2010-250905 A | 11/2010 |
| TW | 201348722 A | 12/2013 |

* cited by examiner

*Primary Examiner* — Vanthu T Nguyen
(74) *Attorney, Agent, or Firm* — Oblon, McClelland, Maier & Neustadt, L.L.P.

(57) ABSTRACT

According to a certain embodiment, the semiconductor integrated circuit includes a plurality of memories and a first control circuit configured to control the plurality of memories. The first control circuit includes a first state transition circuit configured to execute at least one of write control and read control during an operation of the plurality of memories; and a second state transition circuit connected to the first state transition circuit, the second state transition circuit capable of causing the first state transition circuit to sequentially execute tests of the plurality of memories.

6 Claims, 18 Drawing Sheets

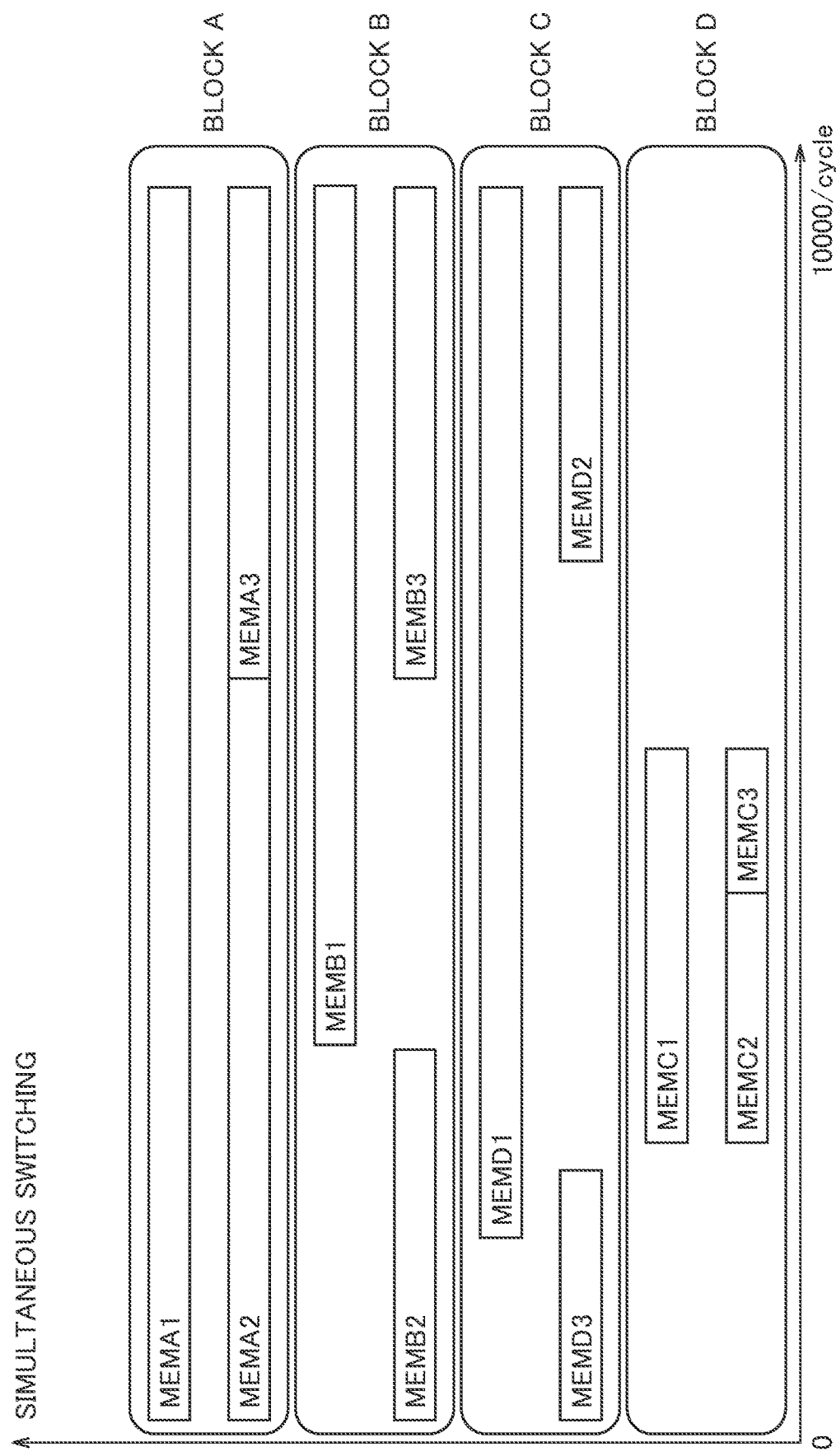

BIST FOR PERFORMING PARALLEL AND SERIAL TEST ON MEMORIES

CROSS REFERENCE TO RELATED APPLICATIONS

This application is based upon and claims the benefit of priority from prior Japanese Patent Application Nos. P2021-15745 filed on Feb. 3, 2021, and P2021-110627 filed on Jul. 2, 2021, the entire contents of which are incorporated herein by reference.

FIELD

Embodiments described herein relate generally to a semiconductor integrated circuit, a design method of such a semiconductor integrated circuit, a design support system of semiconductor integrated circuit, and a non-transitory computer readable medium.

BACKGROUND

In semiconductor integrated circuits, grouping of test target memories by a Build-In Self-Test (BIST) has shifted to layout-based dividing. This is to alleviate wiring congestion caused by dividing according to memory type or test cycle information. On the other hand, a single BIST control circuit controls many memories in currently in vogue for layout-based memory grouping. The grouping is performed regardless of memory configuration. Moreover, the grouping is also performed regardless of a test cycle at the time of testing.

BRIEF DESCRIPTION OF THE DRAWINGS

FIG. 2B is an operation timing chart illustrating a semiconductor integrated circuit according to a second example of the first embodiment.

DETAILED DESCRIPTION

Next, certain embodiments will now be described with reference to the drawings. In the description of the following drawings to be explained, the identical or similar reference sign is attached to the identical or similar part. However, the drawings are merely schematic.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Certain embodiments provide a semiconductor integrated circuit for reducing retries of memory grouping and preventing an increase in peak power due to simultaneous switching in memory tests, a design method of such a semiconductor integrated circuit, a design support system of the semiconductor integrated circuit, and a non-transitory computer readable medium.

According to one embodiment, a semiconductor integrated circuit includes a plurality of memories, and a first control circuit configured to control the plurality of memories. The first control circuit includes a first state transition circuit configured to execute at least one of write control and read control during an operation of the plurality of memories; and a second state transition circuit connected to the first state transition circuit, the second state transition circuit capable of causing the first state transition circuit to sequentially execute tests of the plurality of memories.

(Semiconductor Integrated Circuit according to First Embodiment)

Figure 1A:
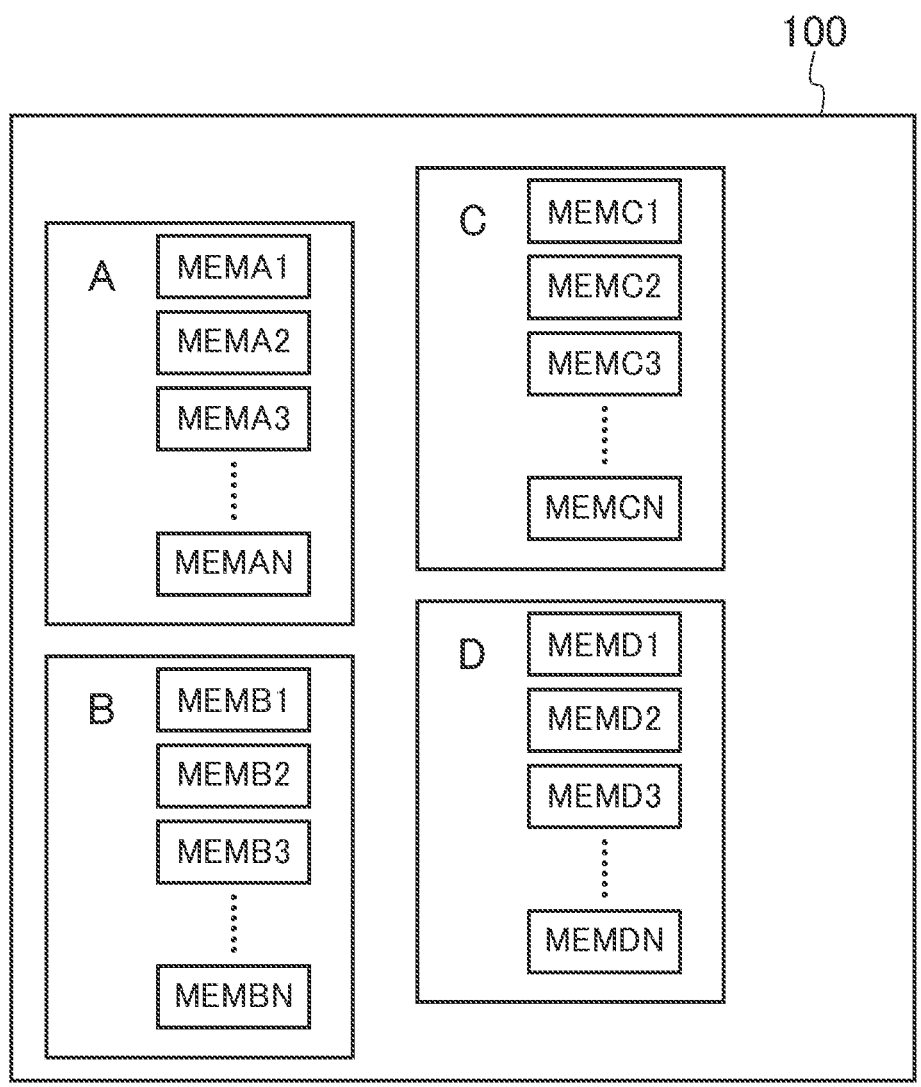
FIG. 1A is a schematic diagram for explaining a divided state of a memory in a semiconductor integrated circuit according to a first embodiment.

As illustrated in FIG. 1A, a plurality of memories MEMA1 to MEMAN, MEMB1 to MEMBN, MEMC1 to MEMCN, and MEMD1 to MEMDN are divided, on a semiconductor substrate 100. The memories MEMA1 to MEMAN are laid out in a block A, the memories MEMB1 to MEMBN are laid out in a block B, the memories MEMC1 to MEMCN are laid out in a block C, and the memories MEMD1 to MEMDN are laid out in a block D.

Each block may also be as a functional block. The functional block is a semiconductor Integrated Circuits (IC) structure having a specific function. For example, integrated circuits, such as a Static Random Access Memory (SRAM), a Read Only Memory (ROM), a Dynamic Random Access Memory (DRAM), and a Central Processing Unit (CPU), correspond to the functional block. Alternatively, the functional block may be a block in which memories having close layout distances are grouped together.

There are a plurality of types in memory types, such as single port memory and dual port memory. Since a test control circuit becomes further complicated if a memory of a different memory types are grouped in the same block, it may be a block in which memories of the same type are grouped together. That is, when grouping a plurality of memories into a plurality of blocks, memories of the same memory type may be grouped into the same group.

Also, if frequencies of clock signals connected to the memory are different from one another, the test control circuit becomes complicated. That is, when grouping a plurality of memories into a plurality of blocks, the memories connected to the same clock signal may be grouped into the same group. Other combinations of these conditions may be used to group the memories into blocks. Such dividing (i.e., grouping) may be referred to as layout-based dividing (i.e., layout-based grouping).

In the following description, blocks A, B, C, and D are all operated with clocks of the same frequency, and the memories in the same block are of the same memory type in classification, such as single port memory, dual port memory, or the like.

Figure 1B:
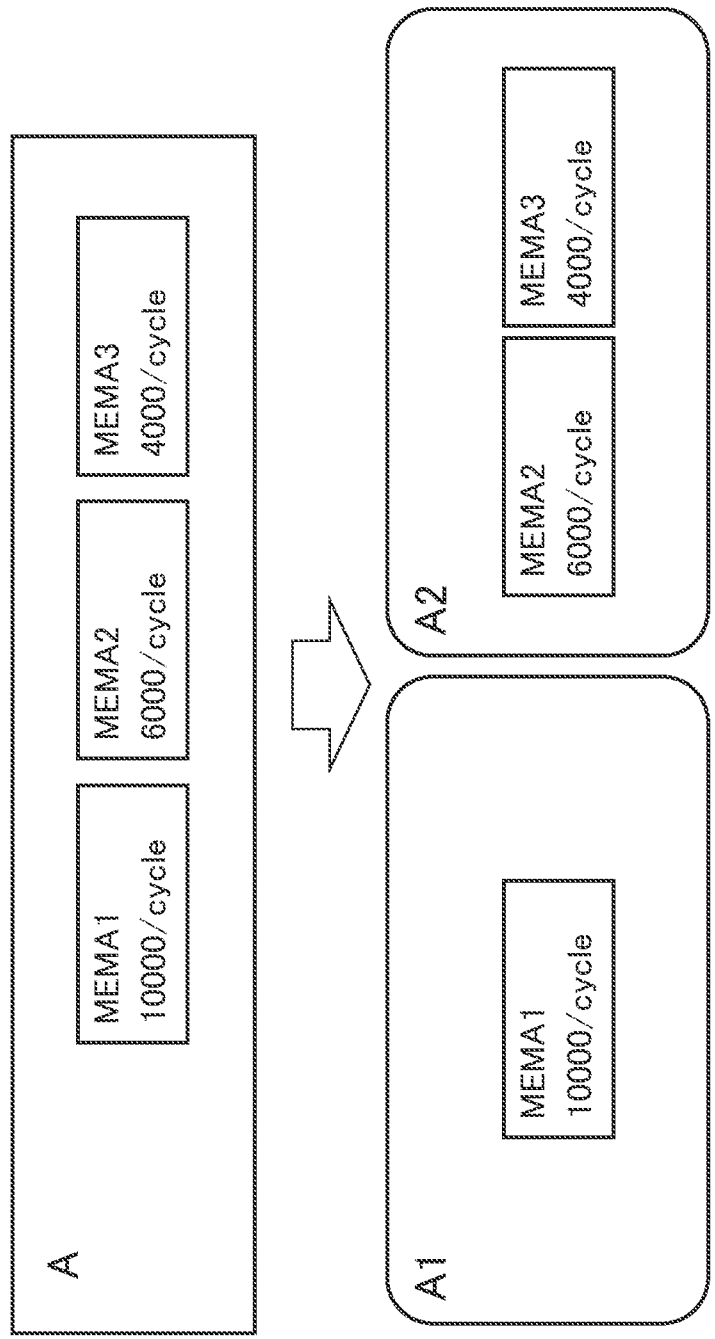
FIG. 1B is a schematic diagram for explaining the divided state of the memory in the semiconductor integrated circuit according to the first embodiment.

FIG. 1B illustrates a practical example of grouping of the memories included in the block A.

As illustrated in FIG. 1B, it is assumed that the block A includes, for example, three memories. In FIG. 1B, the numerical value of Cycle represents a test cycle value required by each memory.

The memories included in the block A are grouped by using as an index the number of test cycles, which is the number of memory tests executed during the memory test, to be divided into two groups, subblocks A1 and A2. Such test-cycle based dividing is targeted within each block grouped by the layout-based dividing illustrated in FIG. 1A. The number of test cycles as an index is derived from a configuration of the number of words and/or the bit line width of each memory, test algorithm information, and the like, and the memory group is divided into sub groups in accordance therewith. With the memory having the maximum number of test cycles as a threshold value, the remaining memories are grouped to be within a range equal to or less than the threshold value. In this way, in the first embodiment, three memories are divided into two groups A1 and A2 by using the number of test cycles as an index. The group A1 includes the memory MEMA1 having the test cycle of 10000 cycles. The group A2 includes the memory MEMA2 having the test cycle of 6000 cycles and the memory MEMA3 having the test cycle of 4000 cycles. The threshold value is 10000 cycles for the memory MEMA1, and the value obtained by adding the number of test cycles for the memories MEMA2 and MEMA3 does not exceed the threshold value. Moreover, BIST control circuits A1 and A2 configured to control the memory tests are respectively disposed in the groups A1 and A2. Such memory grouping in the block depending on the number of test cycles as the index may be referred as neighborhood memory grouping. The term neighborhood memory used herein represents a memory that may be tested in the same BIST control circuit.

When a block including a plurality of memories is divided into a plurality of subblocks, one of the plurality of memories that required the maximum number of test cycles during a memory test may be allocated to one subblock, and the remaining memories may be allocated to other subblocks so that the sum total of the numbers of test cycles of the remaining memories may be equal to or less than the maximum number of test cycles.

The BIST refers to Built-In Self Test, which means that tester operations including, for example, "generating of test pattern", "matching test result with expected value", and the like are executed in a chip. The BIST control circuit includes a circuit in the chip configured to control such tester operations.

Although not illustrated, the blocks B, C, and D are similarly divided. In the memories, the number of test cycles required increases in proportion to the number of words and the number of bits, and an area of the BIST control circuit also increases. If a memory with a small number of test cycles and a memory with the large number of test cycles are entered in the same group, the whole number of test cycles is rate-determined by the memory with the large number of test cycles. Therefore, if memories with the similar number of test cycles are grouped in the same group, an influence on the whole number of test cycles and the area of the BIST control circuit becomes relatively smaller.

Figure 1C:
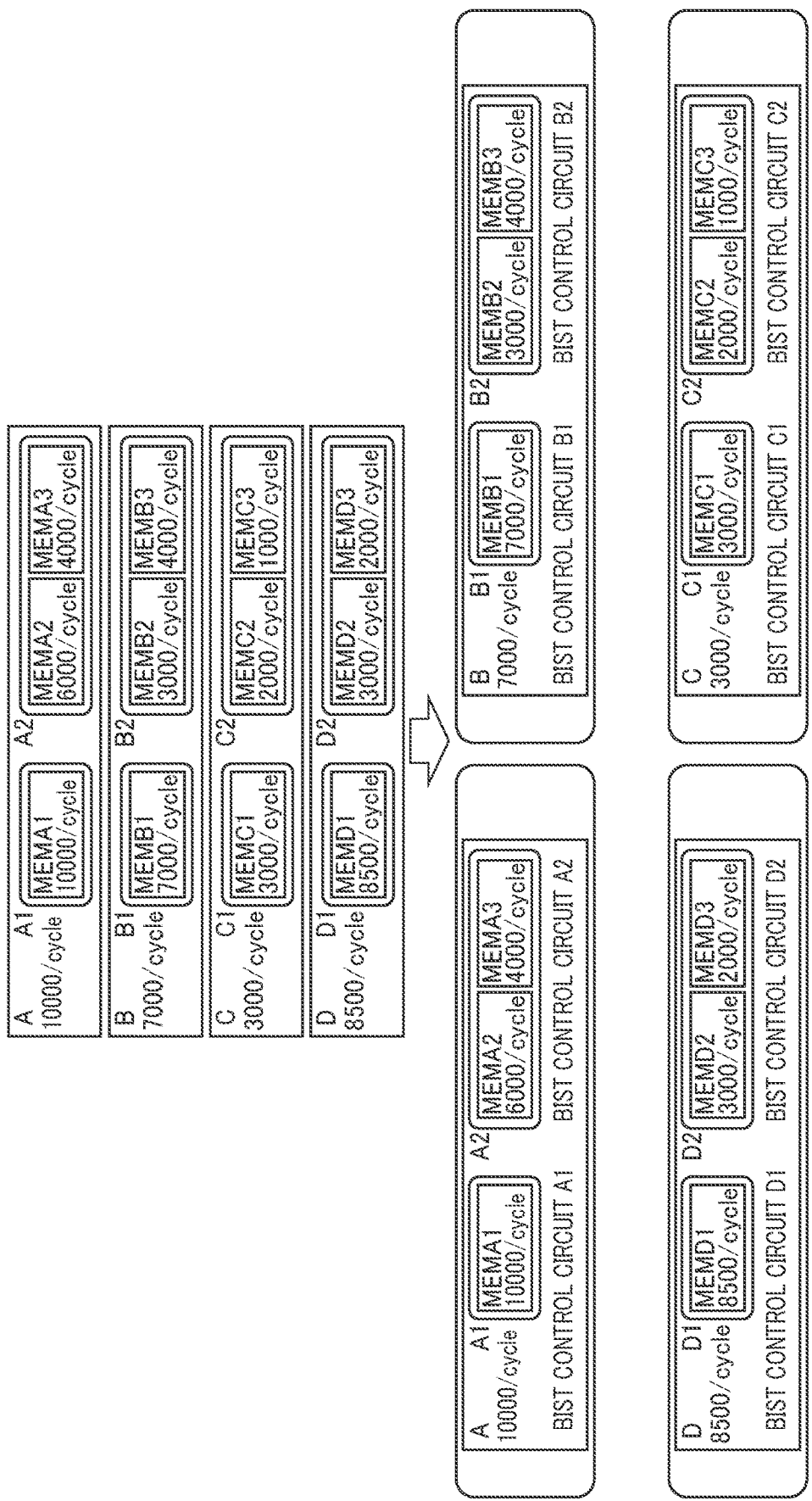
FIG. 1C is a schematic diagram for explaining the divided state of the memory in the semiconductor integrated circuit according to the first embodiment.

FIG. 1C illustrates a state where dividing between blocks A, B, and C and D is performed by means of the first embodiment. The number of memory test cycles in the same block is rate-determined by the largest number of memory test cycles. For this reason, the largest number of memory test cycles is set as a threshold value as the maximum of the number of test cycles. When grouping, grouping is performed the value obtained by adding the number of test cycles of the memories in each group so as not to exceed the threshold value.

The blocks A1 and A2 respectively include the BIST control circuits A1 and A2. The blocks B1 and B2 respectively include the BIST control circuits B1 and B2.

The blocks C1 and C2 respectively include the BIST control circuits C1 and C2.

The blocks D1 and D2 respectively include the BIST control circuits D1 and D2.

Figure 1D:
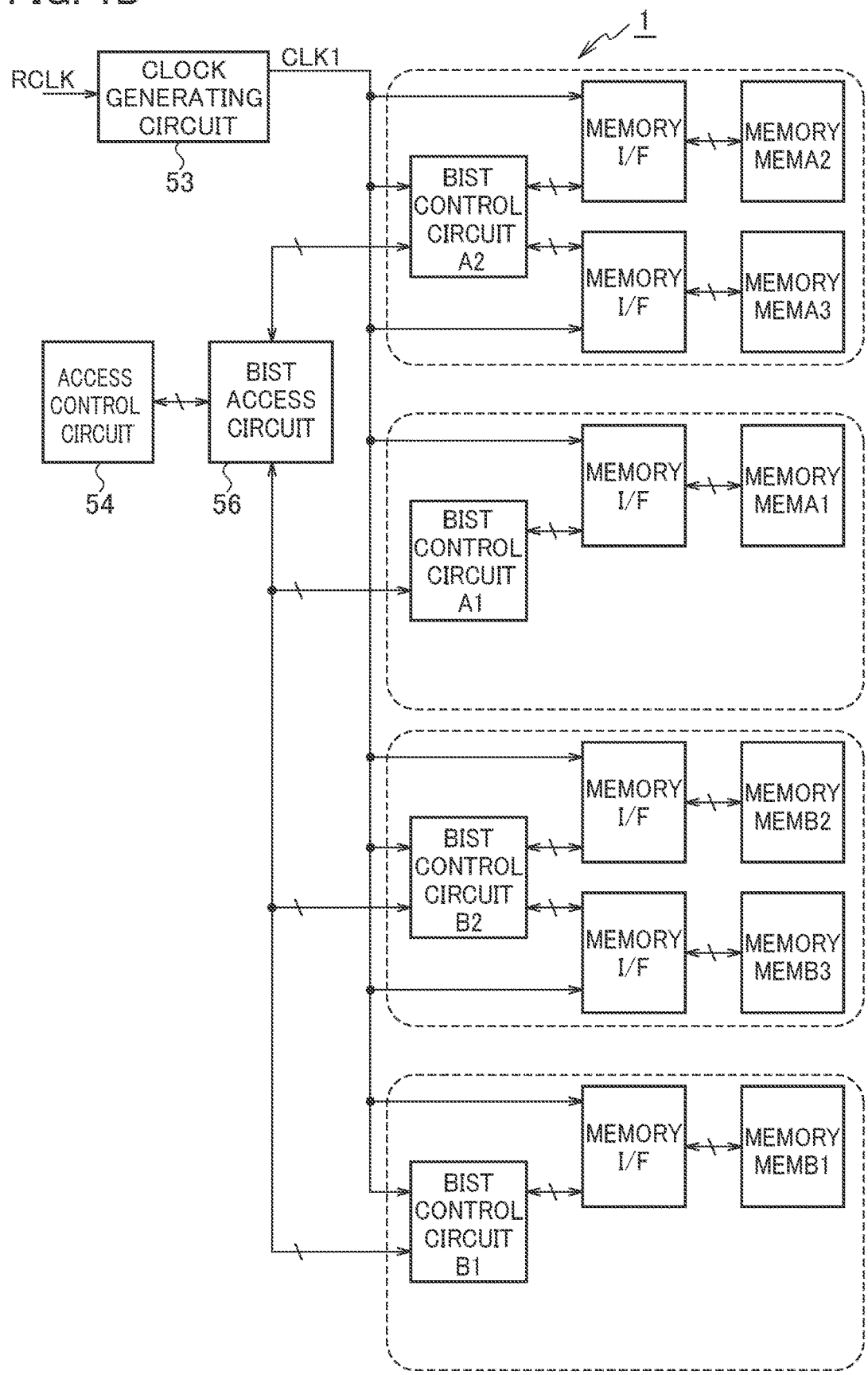
FIG. 1D is a block diagram illustrating the semiconductor integrated circuit according to the first embodiment.

With reference to FIG. 1D, a semiconductor integrated circuit 1 including the blocks A1, A2 and B1, B2 will now be described in detail.

The semiconductor integrated circuit 1 includes: a clock generating circuit 53; blocks A1, A2, B1 and B2, each connected to the clock generating circuit 53; an access control circuit 54; a BIST access circuit 56 connected to the access control circuit 54; and BIST control circuits A1, A2, B1 and B2, each connected to the BIST access circuit 56.

The clock generating circuit 53 is a circuit configured to generate a clock signal CLK1 having a certain frequency, on the basis of a reference clock signal RCLK, to be supplied to an internal circuit, and is composed of, for example, a Phase Locked Loop (PLL) or the like. In this case, the internal circuit corresponds to each circuit, such as the block A1, the block A2, the block B1, and the block B2.

The BIST control circuits A1, A2, B1, and B2 are circuits configured to control the memory BIST test. The BIST control circuits A1, A2, B1, and B2 and the memory I/F are synchronized with the clock signal CLK1 supplied from the clock generating circuit 53. The BIST access circuits 56 are circuits configured to manage the BIST control circuits A1, A2, B1, and B2.

An access control circuit 54 is configured to control the BIST access circuit 56. For example, a Joint Test Action Group (JTAG) controller (TAPC) defined in the IEEE 1149.1 standard is used for the access control circuit 54. Alternatively, the BIST access circuit 56 may be controlled directly from an external terminal.

The memory I/F is a circuit configured to select the clock signal CLK1 and a signal for testing generated from the BIST control circuits A1, A2, B1, and B2, and to compare expected values, for example. For example, one memory I/F is incorporated for each memory MEMA2 and memory MEMA3.

The respective memories MEMA2 and MEMA3 are memories to be tested. For example, SRAM, ROM, DRAM, or the like can be applied to the memories to be targeted.

The blocks C1, C2, D1, and D2 are not illustrated in FIG. 1D but are similarly configured. To each of the blocks C1, C2, D1, and D2, the BIST access circuit 56 and a signal line for transmitting the clock signal CLK1 are also connected, similarly to each of the blocks A1, A2, and B1 and B2.

Figure 1E:
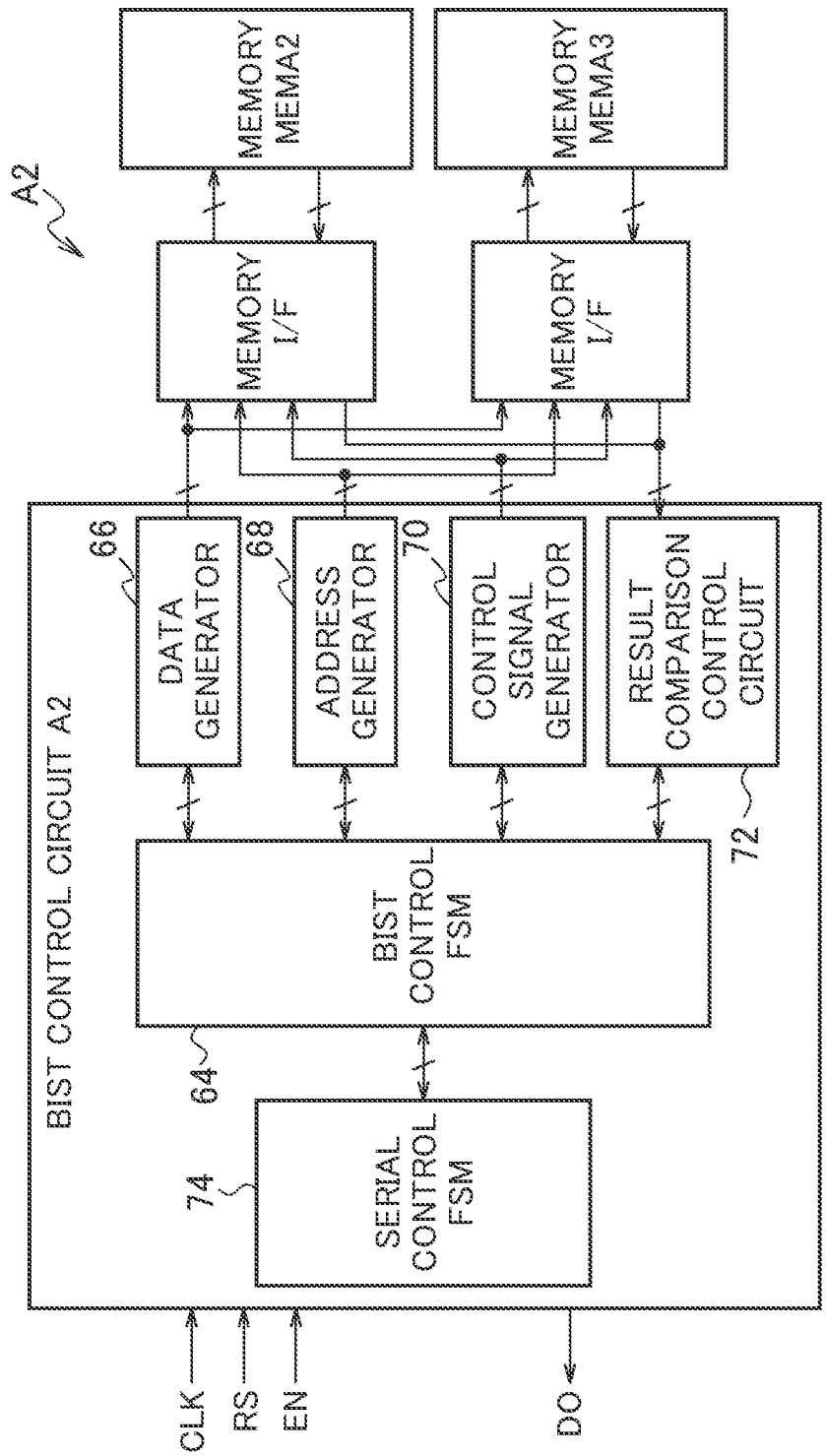
FIG. 1E is an explanatory diagram illustrating a BIST control circuit according to the first embodiment.

As illustrated in FIG. 1E, the semiconductor integrated circuit according to the first embodiment includes the plurality of memories MEMA2 and MEMA3, and the BIST control circuit A2 configured to control the plurality of memories MEMA2 and MEMA3. The BIST control circuit A2 includes: a first state transition circuit (e.g., BIST control FSM) 64 configured to execute at least one of write control and read control during an operation of the plurality of memories; and a second state transition circuit (e.g., serial control FSM) 74 that is connected to the first state transition circuit 64 and is capable of causing the first state transition circuit 64 to sequentially execute the tests of the plurality of memories. In this case, during operation of the plurality of memories corresponds to, for example, during tests of the plurality of memories.

As illustrated in FIG. 1E, in the block A2, the BIST control circuit A2, the memory interface (I/F), and the memory MEMA2 and memory MEMA3 are disposed.

The BIST control circuit A2 is connected to the plurality of memory interfaces (I/F).

The BIST control circuit A2 is connected to the memory MEMA2 and the memory MEMA3 respectively through the memory interfaces (I/Fs).

The BIST control circuit A2 includes a first state transition circuit 64, a data generator 66, an address generator 68, a control signal generator 70, and a result comparison control circuit 72. The first state transition circuit 64 is composed of a BIST control Finite State Machine (FSM). The data generator 66, the address generator 68, the control signal generator 70, and the result comparison control circuit 72 are controlled by the first state transition circuit 64.

The first state transition circuit 64 is a state machine configured to execute a series of controls such as read control and write control in memory tests. The data generator 66 is a circuit configured to generate at least one of a read value and a write value for the memory. The address generator 68 is a circuit configured to generate an address value of the memory. The control signal generator 70 is a circuit configured to generate a control signal for executing at least one of read control and write control of the memory. The result comparison control circuit is a circuit configured to generate a flag and the like in accordance with a comparison between the expected value generated by the BIST control circuit 58 and an actual memory data value.

The data generator 66, the address generator 68, the control signal generator 70, and the result comparison control circuit 72 are connected to each memory interface (I/F).

The clock signal CLK, a reset signal RS, and an enable signal EN are supplied to the BIST control circuit A2 from the outside. The reset signal RS is a signal for initializing setting of the BIST control circuit A2, and the enable signal EN is a signal for controlling an on-off operation of the BIST control circuit A2. The clock signal CLK is supplied from the clock generating circuit 53.

Moreover, a data output signal DO is provided from the BIST control circuit A2. The data output signal DO is a signal for providing a value of an internal register, and the like. The blocks A1, B1, B2, C1, C2, D1, and D2 are configured in the same manner as the block A2.

Figure 1F:
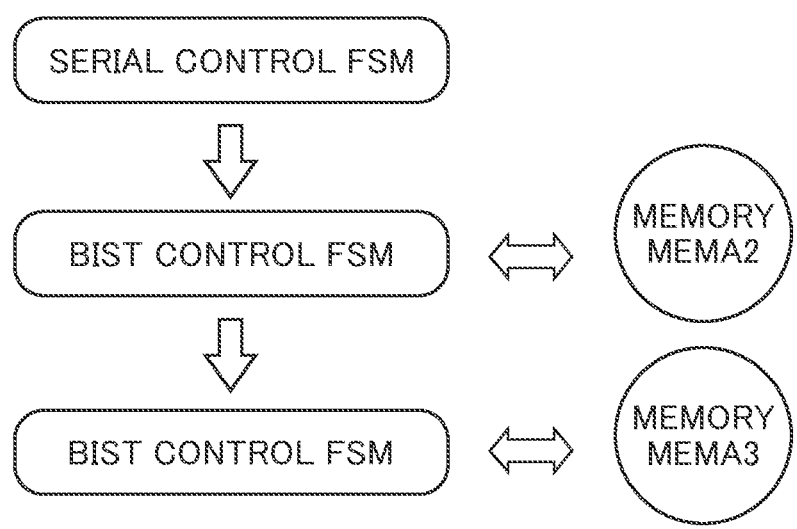
FIG. 1F is an operation explanatory diagram illustrating a serial control FSM.

In the semiconductor integrated circuit 1 according to the first embodiment, the tests for the memory MEMA2 and the memory MEMA3, each included in block A2, are sequentially started by incorporating the serial control FSM (state machine) 74 thereinto. FIG. 1F illustrates an operation of the BIST control FSM 64 including the serial control FSM 74. The memory test can be sequentially started to each of the memory MEMA2 and the memory MEMA3 included in the group A2.

Similarly, the BIST control circuit B2 can control start timing of the memory tests for the memory MEMB2 and the memory MEMB3, so as to be sequentially started, such that the memory MEMB2 is tested after the memory MEMB3 is tested.

Similarly, the BIST control circuit C2 can control start timing of the memory tests for the memory MEMC2 and the memory MEMC3, so as to be sequentially started, such that the memory MEMC2 is tested after the memory MEMC3 is tested.

Similarly, the BIST control circuit D2 can control start timing of the memory tests for the memory MEMD2 and the memory MEMD3, so as to be sequentially started, such that the memory MEMD2 is tested after the memory MEMD3 is tested.

The BIST control circuits A1, B1, C1, and D1 can respectively control the start timing of the memory tests for the memories MEMA1, MEMB1, MEMC1, and MEMD1.

(Memory Test Operation Example of Semiconductor Integrated Circuit according to First Example of First Embodiment)

(Operation Timing Chart)

Figure 2A:
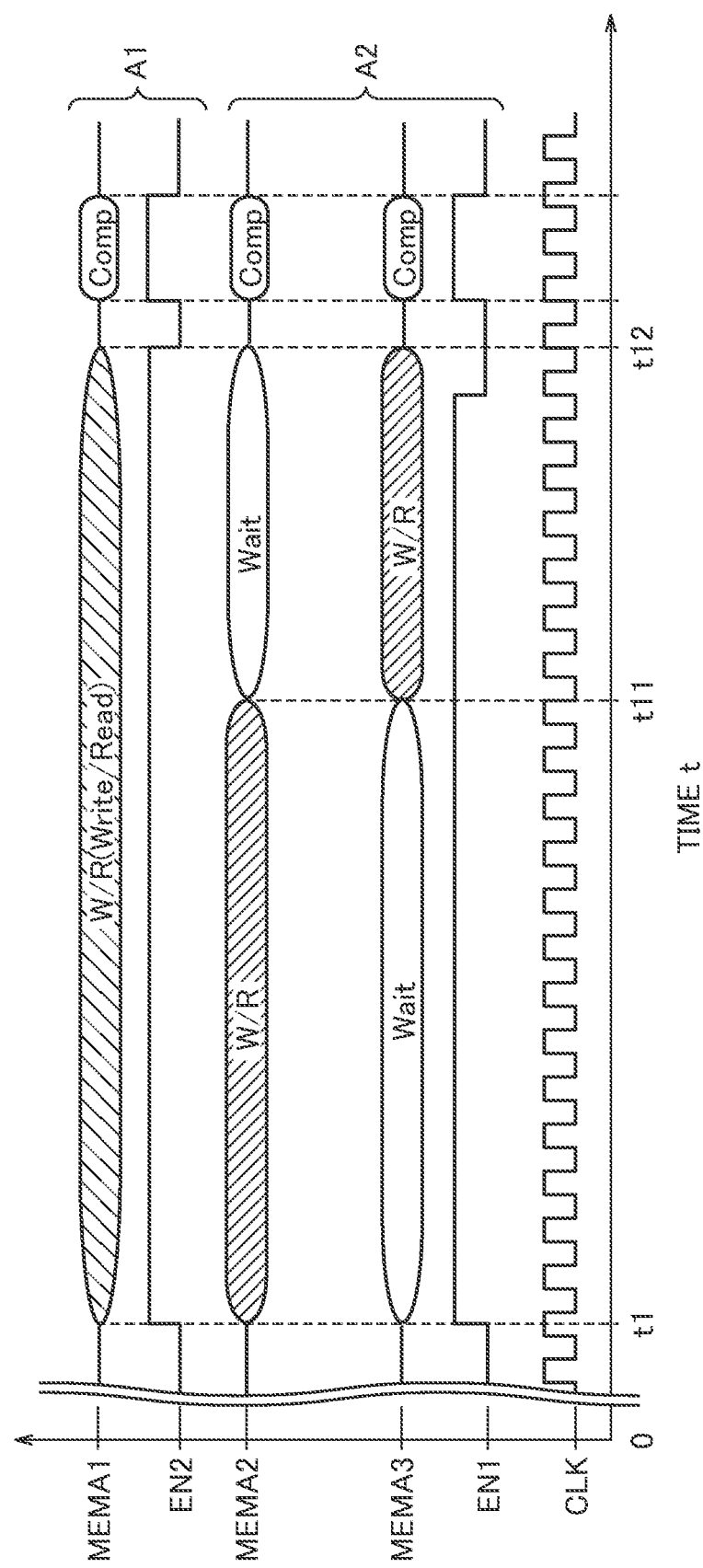
FIG. 2A is an operation timing chart illustrating a semiconductor integrated circuit according to a first example of the first embodiment.

FIG. 2A illustrates a first example of an operation timing chart of the semiconductor integrated circuit according to the first embodiment. FIG. 2A illustrates two blocks A1 and A2 operated in accordance with the clock signal CLK. The memories MEMA2 and MEMA3 are driven in accordance with the state machine sequentially with turning ON of the enable signal EN1, and the memory MEMA1 is simultaneously driven with the turning ON of the enable signal EN2. In the time period when the enable signal EN1 is ON, a write and/or read operation and a wait operation of the memories MEMA2 and MEMA3 are executed. In this way, in the time period when the enable signal EN1 is ON, the write and/or read operation of the memories MEMA2 and MEMA3 are sequentially executed. In the time period when the enable signal EN2 is ON, the write and/or read operation of the memory MEMA1 is executed.

During the time period t1 to t11 when the enable signal EN1 the enable signal EN2 is simultaneously ON, the memories MEMA1 and MEMA2 are accessed. On the other hand, during the time period t11 to t12 when the enable signal EN1 the enable signal EN2 is simultaneously ON, the memories MEMA3 and MEMA1 are accessed.

In FIG. 2A, the write and/or read operation of the memory MEMA2 is repeatedly executed for 6000 cycles during the time period t1 to t11. The write and/or read operation of the memory MEMA3 is repeatedly executed for 4000 cycles during the time period t11 to t12. The write and/or read operation of the memory MEMA1 is repeatedly executed for 10000 cycles during the time period t1 to t12.

(Effect Produced in First Example of First Embodiment)

The memory access can be distributed, in the first example of the present embodiment. For this reason, concentration of peak power can be avoided.

Moreover, if the memories MEMA1, MEMA2, and MEMA3 are sequentially driven in order to avoid the concentration of peak power, the write and/or read operation will require a total of 20,000 cycles. In the first example, the memory tests are driven in a distributed manner, and thereby the concentration of peak power can be reduced and the test time can be shortened.

(Memory Test Operation Example of Semiconductor Integrated Circuit according to Second Example of First Embodiment)

FIG. 2B illustrates a second example of an operation timing chart of the semiconductor integrated circuit according to the first embodiment. In FIG. 2B, the distributed driving of the memory access as in the first example is applied to each block. As illustrated in FIG. 2B, simultaneous switching associated with the memory accesses can be suppressed by adjusting the start timing of the memory tests among the functional blocks A, B, C, and D, and also adjusting the start timing of the memory test also in each block. For example, the number of memories to be switched at the same time up to 10000 cycles is always adjusted to be equal to or less than six. In this case, the functional block corresponds to an integrated circuit structure having a specific function. For example, integrated circuits, such as SRAM, ROM, DRAM, and Central Processing Unit (CPU), are functional blocks. For example, in a functional block called the SRAM, the memory that may be tested by the first BIST control circuit is a neighborhood memory of the first BIST control circuit.

(Effect Produced in Second Example of First Embodiment)

The memory access can be distributed, also in the second example of the present embodiment. For this reason, concentration of peak power can be avoided.

Moreover, the test time can be reduced compared with a case where the blocks A, B, C, and D are sequentially driven in order to avoid the concentration of peak power.

(Semiconductor Integrated Circuit according to Second Embodiment)

Figure 3:
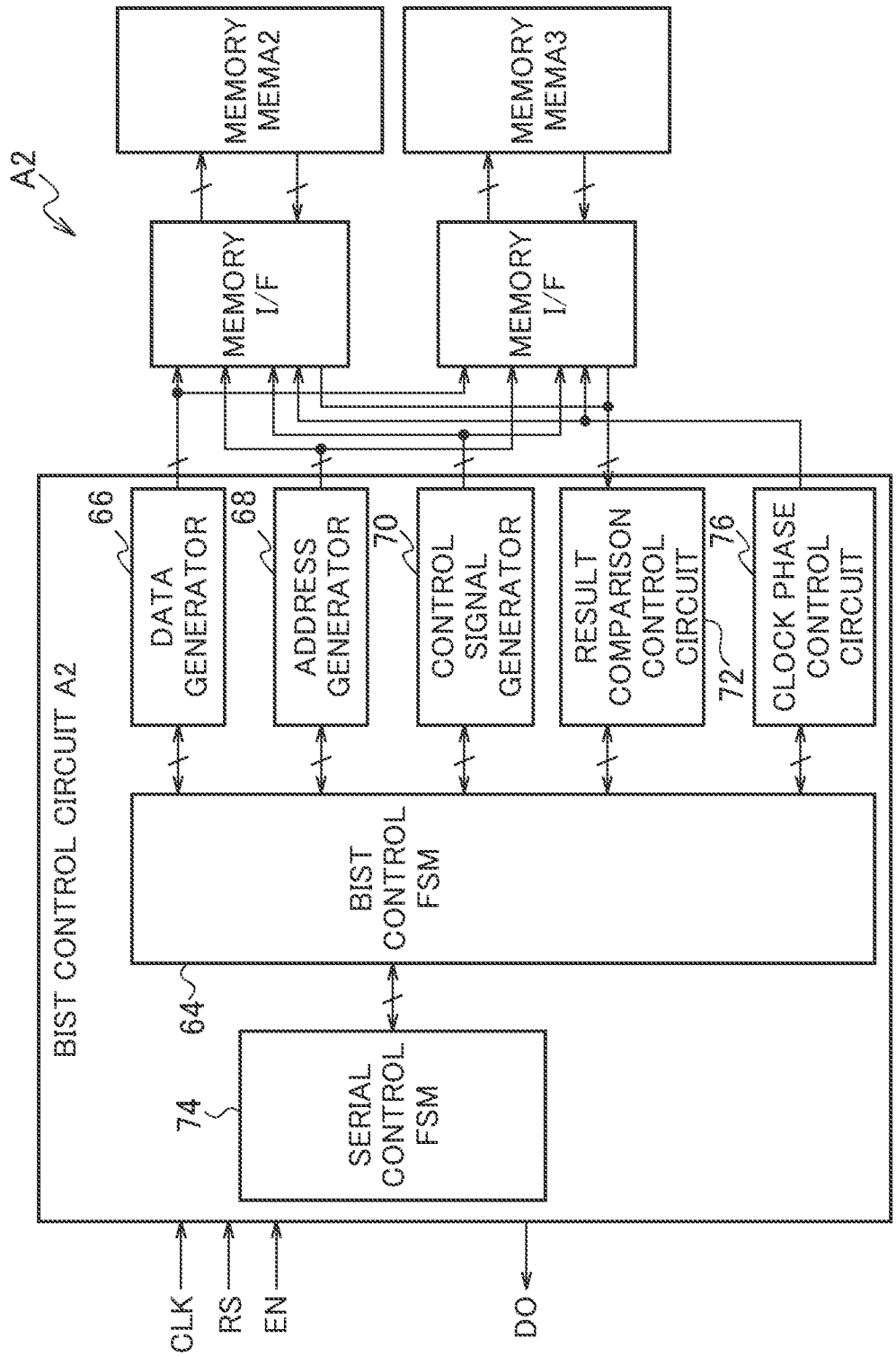
FIG. 3 is a block diagram illustrating a semiconductor integrated circuit according to a second embodiment.

As illustrated in FIG. 3, the semiconductor integrated circuit according to a second embodiment includes a plurality of memories MEMA2 and MEMA3, and a first control circuit (e.g., BIST control circuit A2) configured to control the plurality of memories MEMA2 and MEMA3. The BIST control circuit A2 includes: a first state transition circuit (e.g., BIST control FSM) 64 configured to execute at least one of write control and read control during operation of the plurality of memories MEMA2 and MEMA3; and a second state transition circuit (e.g., serial control FSM) 74 that is connected to the first state transition circuit 64 and is capable of causing the first state transition circuit (e.g., BIST control FSM) 64 to sequentially execute the tests of the plurality of memories MEMA2 and MEMA3. The during operation of the plurality of memories MEMA2 and MEMA3 corresponds to during tests of the plurality of memories MEMA2 and MEMA3.

The semiconductor integrated circuit according to the second embodiment further includes a second control circuit capable of controlling at least one memory different from the memory controlled by the first control circuit (e.g., BIST control circuit A2). The first control circuit (e.g., BIST control circuit A2) includes a clock phase control circuit 76 configured to control a phase of a clock signal of the first control circuit (e.g., BIST control circuit A2) with respect to a phase of the clock signal of the second control circuit.

As illustrated in FIG. 3, the semiconductor integrated circuit according to the second embodiment further includes the clock phase control circuit 76 in the BIST control circuit A2. If clock systems are the same, for example, during operation of a plurality of memories, such as BIST, the phase of the clock can be shifted with respect to the original clock signal CLK by the operation of the clock phase control circuit 76, and thereby simultaneous switching associated with the memory access can be reduced. The configurations of the BIST control circuits A1, B1, C1, C2, D1, and D2 are the same as that of the BIST control circuit A2.

(Example of Clock Phase Control Circuit)

Figure 4:
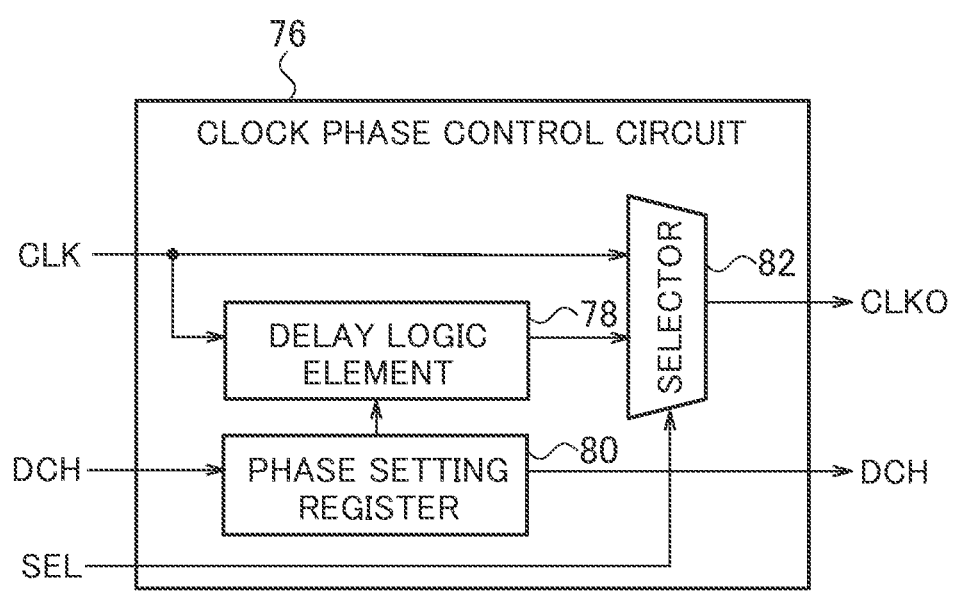
FIG. 4 is a block diagram illustrating a clock phase control circuit.

FIG. 4 is a block diagram illustrating the clock phase control circuit 76.

The clock phase control circuit 76 includes a delay logical element 78, a phase setting register 80, and a selector 82.

The delay logical element 78 is a logic circuit for shifting a phase of the clock signal CLKO of the first control circuit (e.g., BIST control circuit A2) with respect to the original clock signal CLK.

The phase setting register 80 sets a phase difference of the clock signal of the first control circuit (e.g., BIST control circuit A2) with respect to the original clock signal CLK. That is, a phase setting register 80 is a register for determining the phase of the output clock signal CLKO with respect to the original clock signal CLK. Data chain DCH is a chain of a data register defined by IEEE 1149.1 standard, and is supplied to the phase setting register 80 and then is provided from the phase setting register 80.

The selector 82 selects any one of the original clock signal CLK or the clock signal to which the phase difference is set.

In FIG. 4, the clock signal CLK is the same as the clock signal CLK1 (refer to FIG. 1D) supplied to the BIST control circuit A2. The output clock signal CLKO is a clock signal in which the phase is in phase with the original clock signal CLK or the phase is shifted with respect to the original clock signal CLK.

The select signal SEL is a signal for selecting the clock signal CLK. A length of the phase setting register 80 varies depending on the phase difference of the output clock signal CLKO with respect to the original clock signal CLK. If the phase difference is, for example, three stages of 45°, 90°, and 135°, the length of the register needs to be 2 bits.

(Operation Timing Chart)

Figure 5:
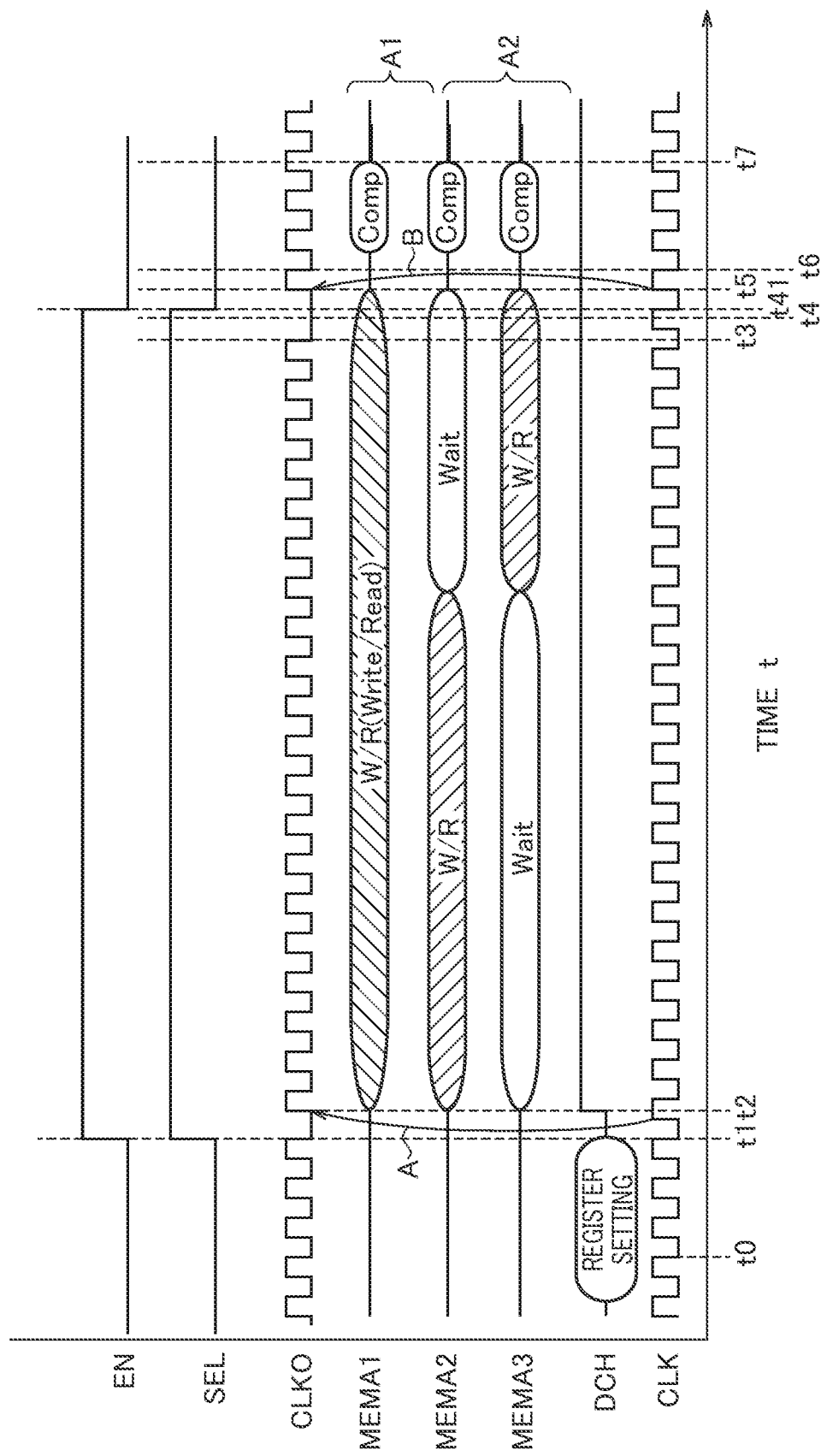
FIG. 5 is an operation timing chart of the semiconductor integrated circuit according to the second embodiment.

FIG. 5 is an operation timing chart of the semiconductor integrated circuit according to the second embodiment. Only operation of the block A is illustrated herein as an example.

(a) First, before starting a memory test, the phase setting register 80 is accessed from the data chain DCH to set a value of a desired phase difference. The time period of the REGISTER SETTING is an access period for setting the phase setting register 80.

(b) Next, after the start of the memory test, the enable signal EN and the select signal SEL are simultaneously turned on at the time t1.

(c) When the enable signal EN and the select signal SEL change to the high level H, the output clock signal CLKO in which the phase is shifted with respect to the original clock signal CLK based on the value of the set phase difference is transmitted to the memories MEMA1, MEMA2, and MEMA3, and the test is started at time t2. In this case, as illustrated in the arrow A, the phase of the output clock signal CLKO is shifted with respect to the original clock signal CLK.

(d) The write and/or read operations of the memories are executed during the time period t2 to t5. The memory MEMA1 is operated in synchronization with the CLK0 and the memories MEMA2 and MEMA3 are operated in synchronization with the CLK1.

(e) At the time t41, when the write and/or read operations of the memories are completed and the enable signal EN and the select signal SEL are turned to the low level, the clock phase returns to normal. In this case, as illustrated in the arrow B, with respect to the clock signal CLK, the phase difference of the output clock signal CLKO returns to zero and the phase difference is eliminated.

The same drive method can be applied to the block B, block C, and block D. Moreover, such an operation can also be applied to the first embodiment.

(Effect Produced in Second Embodiment)

The simultaneous switching associated with the memory access is can further be suppressed.

(Semiconductor Integrated Circuit according to Third Embodiment)

Figure 6:
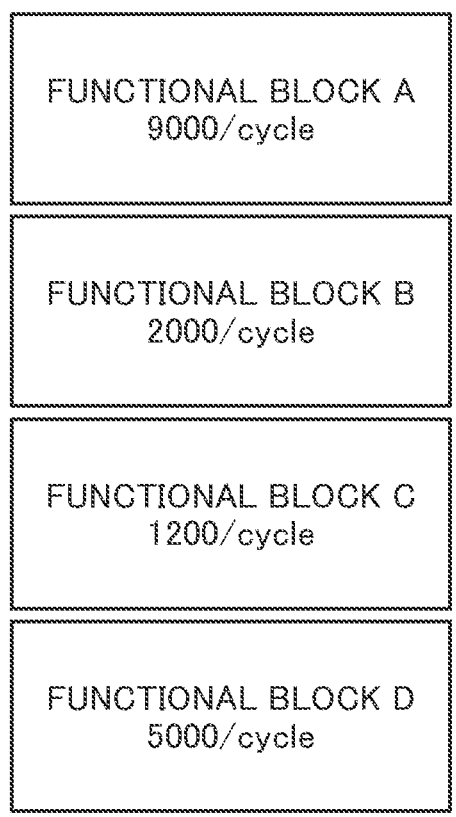
FIG. 6 is a schematic diagram for explaining a divided state of a memory in a semiconductor integrated circuit according to a third embodiment.

FIG. 6 illustrates a divided state (i.e., grouped state) of the memories in the semiconductor integrated circuit in a third embodiment. The number of the maximum test cycles of the memory included in each functional block A, B, C, and D is illustrated in FIG. 6.

Figure 7:
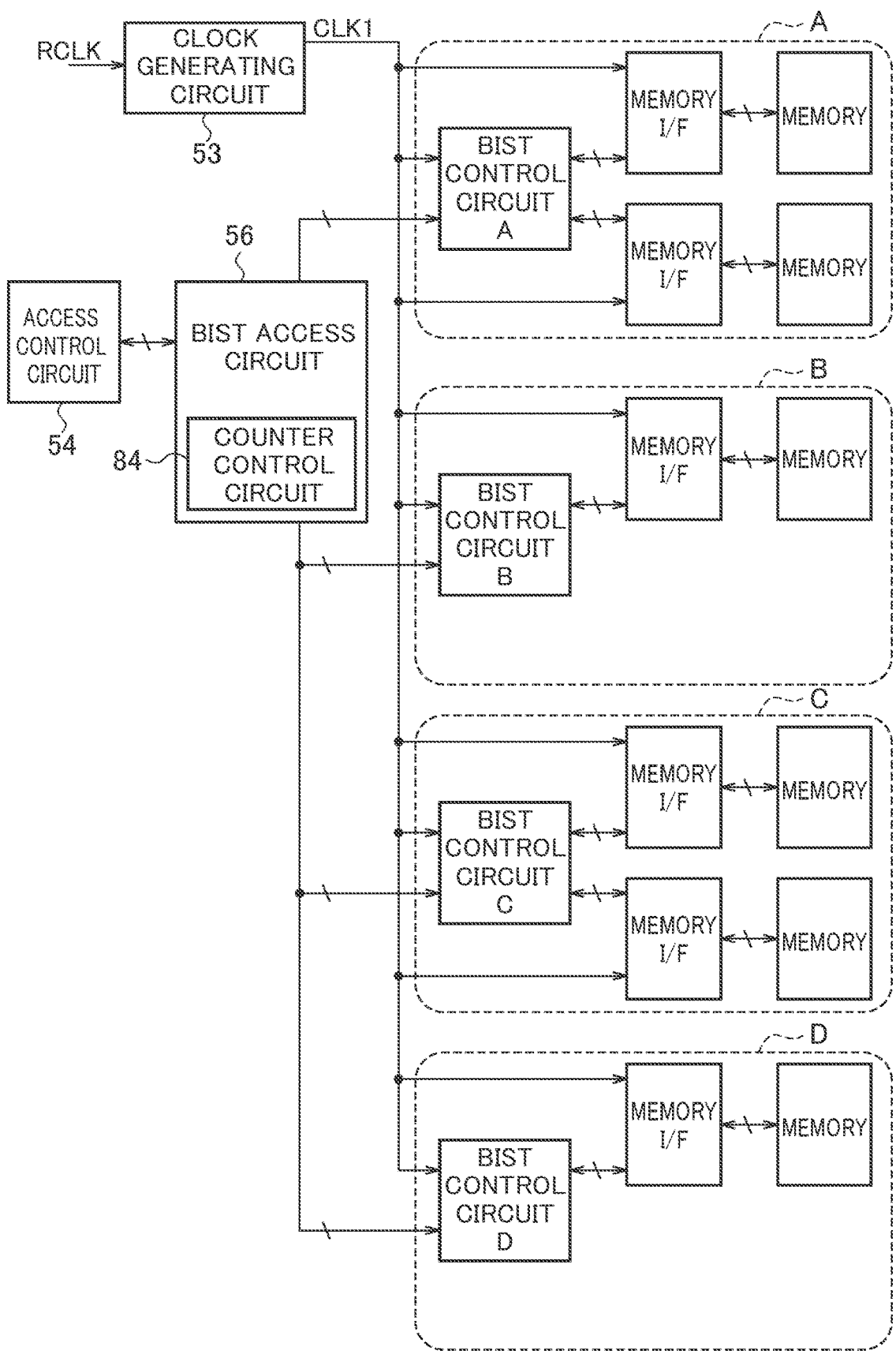
FIG. 7 is a block diagram illustrating the semiconductor integrated circuit according to the third embodiment.

As illustrated in FIG. 7, the semiconductor integrated circuit according to the third embodiment includes: a plurality of functional blocks (A to D) including a plurality of memories including at least a first memory, a second memory, and a third memory, and control circuits (e.g., BIST control circuits A to D) capable of independently controlling the first memory and the second memory, and the third memory; and a BIST access circuit 56 that is connected to the control circuits (e.g., BIST control circuits A to D) and is capable of accessing to the control circuits (e.g., BIST control circuits A to D).

The BIST access circuit 56 is capable of transmitting an enable signal EN to the control circuits (e.g., BIST control circuits A to D). The enable signal EN is a signal for starting a control operation of the third memory after the control operation of the first and second memories is completed or for starting the control operation of the first and second memories after the control operation of the third memory is completed.

The BIST access circuit 56 includes a counter control circuit 84 configured to start the control circuits (e.g., BIST control circuits A to D) in accordance with the enable signal EN.

As illustrated in FIG. 7, the counter control circuit 84 is incorporated in the BIST access circuit 56 of the third embodiment. Alternatively, the counter control circuit 84 may be provided independently from the BIST access circuit 56. Moreover, the block A is described as including two memories, the block B is described as including one memory, the block C is described as including two memories, and the block D is described as including one memory, but it is not limited to such a configuration. As described in the first and second embodiments, further dividing by neighbor memory may be or may not be performed in each block.

The BIST access circuit 56 is a control circuit configured to comprehensively manage all the BIST control circuits A, B, C, and D. When starting the test, the enable signal for starting up the BIST control circuits A, B, C, and D is provided from the BIST access circuit 56. The enable signal is supplied to the BIST control circuits A, B, C, and D in each functional block A, B, C, and D. The operation of the counter control circuit 84 controls so that the enable signal is transmitted to each functional block at different timing.

(Example of Counter Control Circuit)

Figure 8:
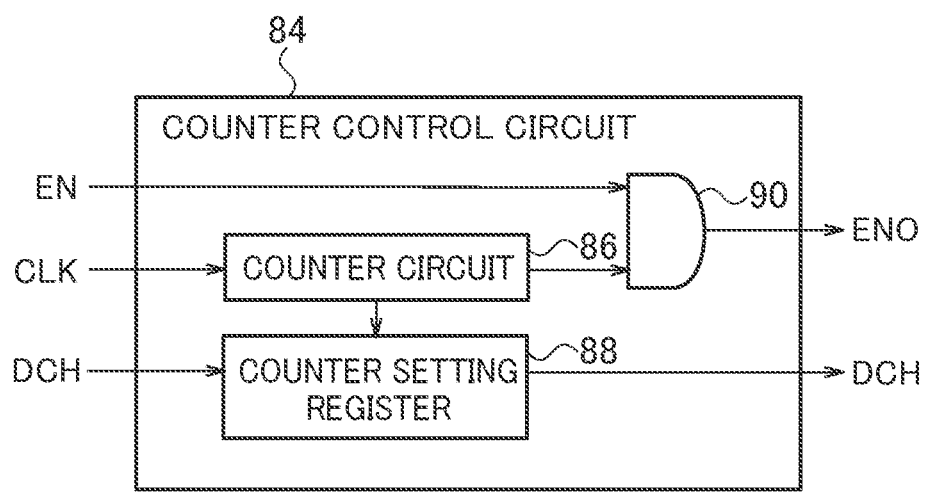
FIG. 8 is a block diagram illustrating a counter control circuit.

FIG. 8 is a block diagram illustrating the counter control circuit 84. It is a circuit structure capable of starting up the GIST control circuits A, B, C, and D at any timing.

The counter control circuit 84 includes a counter circuit 86, a counter setting register 88, and an AND gate 90. The counter circuit 86 counts the number of pulses of the clock signal CLK supplied thereto after the start of the operation during the operation of one functional block among the plurality of functional blocks A, B, C, and D, and then starts the operation of the following functional block. The counter circuit 86 is a circuit configured to count the clock signal CLK, and provides the high level H when the counted value reaches at the predetermined count value.

The counter setting register 88 is a register circuit for setting the count value. That is, the counter setting register 88 is a register circuit that counts the number of pulses of the clock signal CLK. Data chain DCH is a chain of a data register defined by IEEE 1149.1 standard, and is supplied to the counter setting register 88 and then is provided from the counter setting register 88.

The AND gate 90 is a gate circuit configured to provide the enable signal ENO by the logical AND operation between the enable signal EN and the clock signal CLK that has passed through the counter circuit 86.

(Operation Timing Chart)

Figure 9:
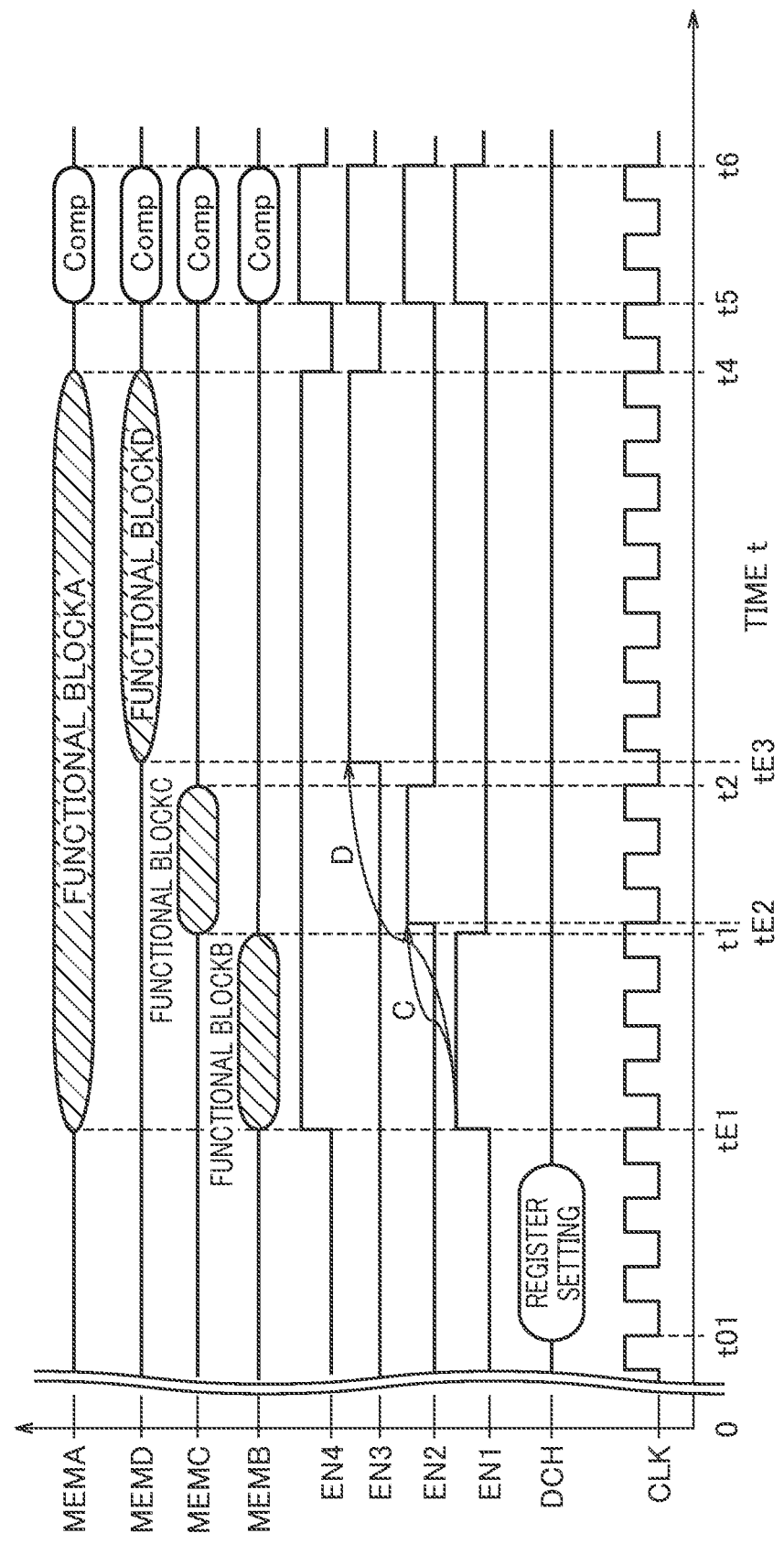
FIG. 9 is an operation timing chart of the semiconductor integrated circuit according to the third embodiment.

In FIG. 9, the write and/or read operation of the memory in the functional block B is repeatedly executed for 2000 cycles during the time period tE1 to t1. The write and/or read operation of the memory in the functional block C is repeatedly executed for 1200 cycles during the time period tE2 to t2. The write and/or read operation of the memory in the functional block D is repeatedly executed for 5000 cycles during the time period tE3 to t4. The write and/or read operation of the memory in the functional block A is repeatedly executed for 9500 cycles during the time period tE1 to t4.

FIG. 9 is an operation timing chart of the semiconductor integrated circuit according to the third embodiment. FIG. 9 is a diagram illustrating an example of the timing chart of the counter control. In FIG. 9, the memories belonging to the functional blocks A, B, C, and D are respectively denoted by the memory MEMA, the memory MEMB, the memory MEMC, and the memory MEMD. An operation thereof will be described hereinafter.

(a) First, before starting a memory test, at the time t01, the counter setting register 88 is accessed from the data chain DCH to set a desired count value with respect to the blocks C and D. The time period of the REGISTER SETTING is an access period for setting the counter setting register 88.

(b) Next, after the start of the memory test, the enable signal EN1 and the enable signal EN4 are simultaneously turned ON, at the time tE1, with respect to the blocks A and B respectively for which count values have not been set, to execute the memory test. The time period tE1 to t1 is a test period for the functional block B. The time period tE1 to t4 is a test period for the functional block A.

(c) Next, when reaching at the count value set for the functional block C, at the time tE2, the enable signal EN2 of the block C is turned ON, as illustrated by the arrow C, and the test for the functional block C is started. The time period tE2 to t2 is a test period for the functional block C.

(d) Next, when reaching at the count value set for the functional block D, at the time tE3, the enable signal EN3 of the block D is turned ON, as illustrated by the arrow D, and the test for the functional block D is started. The time period tE3 to t4 is a test period for the functional block D.

(Effect Produced in Third Embodiment)

The semiconductor integrated circuit according to the third embodiment can provide the BIST control circuit capable of suppressing the simultaneous switching associated with the memory access by using the test-cycle based dividing (block level).

In the semiconductor integrated circuit according to the third embodiment, the counter control circuit can individually control the enable signal for starting the BIST control circuits, and thereby the BIST control circuits can be started up per functional block in any cycles, and the simultaneous switching associated with the memory access can be improved.

The test-cycle based dividing (block level) can be used to improve the simultaneous switching associated with the memory access by starting up the BIST control circuits at the block level using the test cycle (e.g., power consumption) of each BIST control circuit as a parameter.

Other Embodiments (a) With respect to the third embodiment, the clocks may be shifted with regard to the plurality of memories in the functional block as in the second embodiment. In this case, in FIG. 9, the clock for the block A is different from the clocks for the blocks B, C, and D. In this case, the simultaneous switching associated with the memory access can be improved in addition to the effect produced in the third embodiment.

(b) In the above-mentioned embodiments, all the functional blocks A, B, C, and D are connected to the line of the clock signal CLK1 (refer to FIGS. 1D and 7). However, the functional blocks may be connected to the line of a clock signal different therefrom. For example, the functional blocks A and B may be connected to the CLK1 and the functional blocks C and D may be connected to the CLK2. The above embodiments can be applied even in this case as well.

(c) In the above-mentioned embodiment (refer to FIG. 7), the number of the divided functional blocks is four, but is not limited to this example. The number of functional blocks to be divided can be more or less.

(d) In the above-mentioned embodiment (refer to FIG. 1D), the number of divisions based on the neighborhood memory in the functional block is at most two (e.g., the block A is divided into blocks A1 and A2), but the number thereof is not limited to this example and can be more.

(e) In the above-mentioned embodiment (refer to FIG. 1D), the number of memories included in the functional block divided by the neighborhood memory basis is at most 2 (e.g., the memories MEMA2 and MEMA3 are included in the functional block A2), but the number thereof is not limited to this example and can be more.

(Design Method of Semiconductor Integrated Circuit)

Hereinafter, a design method of the semiconductor integrated circuit according to the embodiments will now be described.

(a) First, a plurality of memories to be mounted in the semiconductor integrated circuit are grouped into a plurality of blocks (e.g., blocks A, B, C, and D) on the basis of the layout information and the functional information of the memories (e.g., refer to FIGS. 1A and 6).

(b) Next, in at least one block (e.g., block A) among the plurality of blocks, the at least one block is divided into a plurality of subblocks (e.g., subblocks A1 and A2) on the basis of the number of test cycles, which is the number of memory tests executed during memory tests (e.g., refer FIG. 1B).

(c) Next, after dividing into the plurality of subblocks, power consumption information, indicating the power to be consumed by each of the plurality of blocks during the memory test, is calculated, and on the basis of the power consumption information of the plurality of blocks, the plurality of blocks are grouped into a plurality of upper-level block U1 (e.g., including block A) and upper-level blocks U2 (e.g., including blocks B, C, D) (e.g., refer to FIGS. 6 and 9).

In the design method of the semiconductor integrated circuit according to the embodiments, when grouping a plurality of memories into a plurality of blocks, memories of the same memory type may be grouped into the same group.

Moreover, when grouping a plurality of memories into a plurality of blocks, the memories connected to the same clock signal may be grouped into the same group.

Moreover, when grouping a plurality of memories included in a block into a plurality of subblocks, one of the plurality of memories that required the maximum number of test cycles during a memory test may be allocated to one subblock, and the remaining memories may be allocated to other subblocks so that the sum total of the numbers of test cycles of the remaining memories may be equal to or less than the maximum number of test cycles.

Moreover, in the design method of the semiconductor integrated circuit according to the embodiments, when grouping a plurality of blocks to a plurality of upper-level blocks, one block (e.g., block A) that requires the maximum power consumption during the memory test may be allocated to one upper-level block U1, and the remaining blocks (e.g., blocks B, C, D) may be allocated to the other upper-level blocks U2 so that the sum total of the power consumption of the remaining blocks is equal to or less than the maximum power consumption.

(Design Support System) The semiconductor integrated circuit according to the present embodiments and the design method thereof can be applied to a design technology and a verification device in a memory test in consideration of low power consumption. Hereinafter, a design support system according to the present embodiments will now be described.

Figure 10:
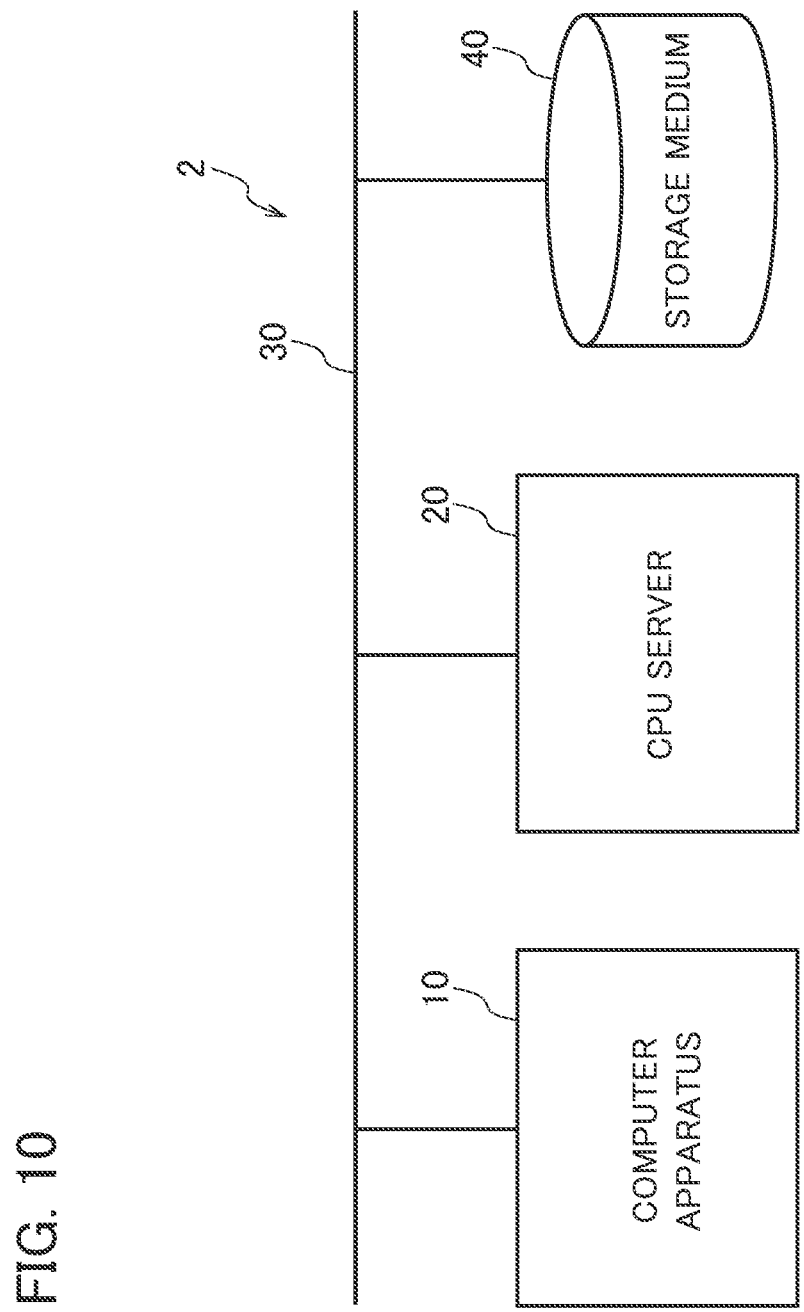
FIG. 10 is a schematic diagram illustrating a configuration of a design support system according to the embodiments.

FIG. 10 is a schematic diagram illustrating a configuration of a design support system 2 according to the embodiments. The design support system 2 includes a computer apparatus 10, a CPU server 20, a network 30, and a storage medium 40.

The design support system 2 includes the computer apparatus 10 operated by a user through the network 30, the CPU server 20 configured to store a computer program used for the design support system 2, and the storage medium 40. The storage medium 40 stores input data for executing the computer program used for the design support system 2, and a message of a verification result.

The computer apparatus 10 may be, for example, a Personal Computer (PC), a thin client terminal, a handheld terminal, or a Personal Digital Assistant (PDA). The CPU server 20 may be, for example, an engineering workstation, a mainframe, or a supercomputer. The network 30 may be, for example, the Internet, an intranet, a local area network (LAN), a telephonic communications network, or a dedicated line. The storage medium 40 may be, for example, a hard disk external storage device, a semiconductor memory device of memory, or a storage medium (media). However, it is not actually limited to these examples.

Figure 11:
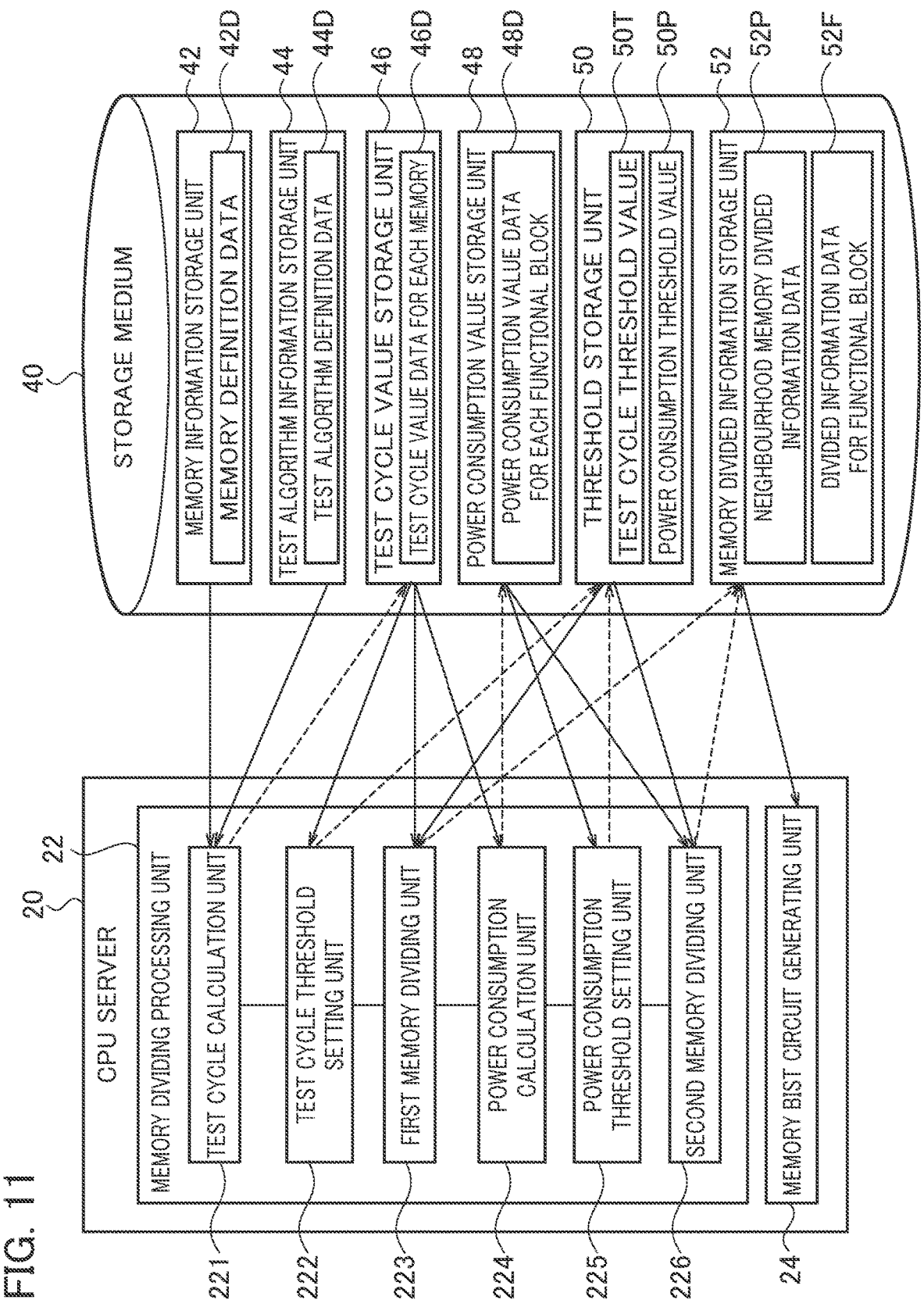
FIG. 11 is a detailed functional block configuration diagram illustrating a server and a storage medium, in the design support system according to the embodiments.

FIG. 11 is a detailed functional block configuration diagram illustrating the CPU server 20 and the storage medium 40 in the design support system 2 according to the embodiments. The design support system 2 includes the CPU server 20 and the storage medium 40 storing data of the CPU server 20.

The CPU server 20 includes: a memory dividing processing unit 22 configured to execute a dividing process with regard to a plurality of blocks and a plurality of memories when the plurality of blocks include the plurality of memories; and a memory BIST circuit generating unit 24 capable of executing a test for the plurality of memories.

The memory dividing processing unit 22 may be, for example, a processing unit of a CPU or a microprocessor, or a semiconductor integrated circuit (IC) that performs the same function. However, it is not actually limited to these examples.

The memory dividing processing unit 22 includes a test cycle calculation unit 221, a test cycle threshold setting unit 222, a first memory dividing unit 223, a power consumption calculation unit 224, a power consumption threshold setting unit 225, and a second memory dividing unit 226.

The test cycle calculation unit 221 can calculate the number of test cycles for each of the plurality of memories.

The test cycle threshold setting unit 222 can set at least one of the respective numbers of test cycles as a test cycle threshold value.

The first memory dividing unit 223 can divide one block including the plurality of memories into a plurality of subblocks on the basis of the numbers of test cycles.

The second memory dividing unit 226 is configured to group a plurality of blocks into a plurality of upper-level blocks on the basis of power consumption information of the plurality of blocks. Accordingly, the second memory dividing unit 226 may be referred to as a memory grouping unit.

The storage medium 40 includes a memory information storage unit 42, a test algorithm information storage unit 44, a test cycle value storage unit 46, a power consumption value storage unit 48, a threshold storage unit 50, and a memory divided information storage unit 52.

The memory information storage unit 42 stores memory definition data 42D. The memory definition data used herein is data for defining a type of the memory (e.g., SRAM, DRAM, the number of clocks, word line and/or data line information, and the like). The test algorithm information storage unit 44 stores test algorithm definition data 44D. The test algorithm definition data is data for defining, for example, a test pattern of the BIST, the number of test repetitions, and the like. The test cycle value storage unit 46 stores test cycle value data for each memory 46D. The power consumption value storage unit 48 stores power consumption value data for each functional block 48D. The threshold storage unit 50 stores test cycle threshold value data 50T and power consumption threshold value data 50P. The memory divided information storage unit 52 stores neighborhood memory divided information data 52P and divided information data for functional block 52F.

The test cycle calculation unit 221 calculates the number of test cycles of each of a plurality of memories on the basis of the memory definition data 42D and the test algorithm definition data 44D, to be stored in the test cycle value storage unit 46 as the test cycle value data 46D for the plurality of memories.

The test cycle threshold setting unit 222 sets a threshold value of the number of test cycles, and stores a setting result in the threshold storage unit 50 as the threshold data 50T for the number of test cycles.

The first memory dividing unit 223 executes a neighborhood-memory based dividing process on the basis of the test cycle value data for each memory 46D, the threshold data 50T for the number of test cycles, and the power consumption threshold value data 50P, and the data after the dividing process is stored in the memory divided information storage unit 52 as the neighborhood memory divided information data 52P for the subblock.

The power consumption calculation unit 224 calculates power consumption on the basis of the test cycle value data 46D of the plurality of memories, and stores the computed result thereof in the power consumption value storage unit 48 as the into power consumption value data for each functional block 48D.

The power consumption threshold setting unit 225 sets a power consumption threshold value on the basis of the power consumption value data for each functional block 48D, and stores the setting result thereof in the threshold storage unit 50 as the power consumption threshold value data 50P.

The second memory dividing unit (i.e., memory grouping unit) 226 executes grouping of the functional block level on the basis of the power consumption value data for each functional block 48D, the threshold data 50T of the number of test cycles, and the power consumption threshold value data 50P, and the data after grouping is stored in the memory divided information storage unit 52 as the divided information data for functional block 52F for the upper-level block.

The memory BIST circuit generating unit 24 generates a memory BIST circuit for the design support system 2 according to the embodiments on the basis of the neighborhood memory divided information data 52P for the subblock and the divided information data for functional block 52F for the upper-level block, which are stored in the memory divided information storage unit 52.

(Flow Chart of Memory Dividing)

Figure 12:
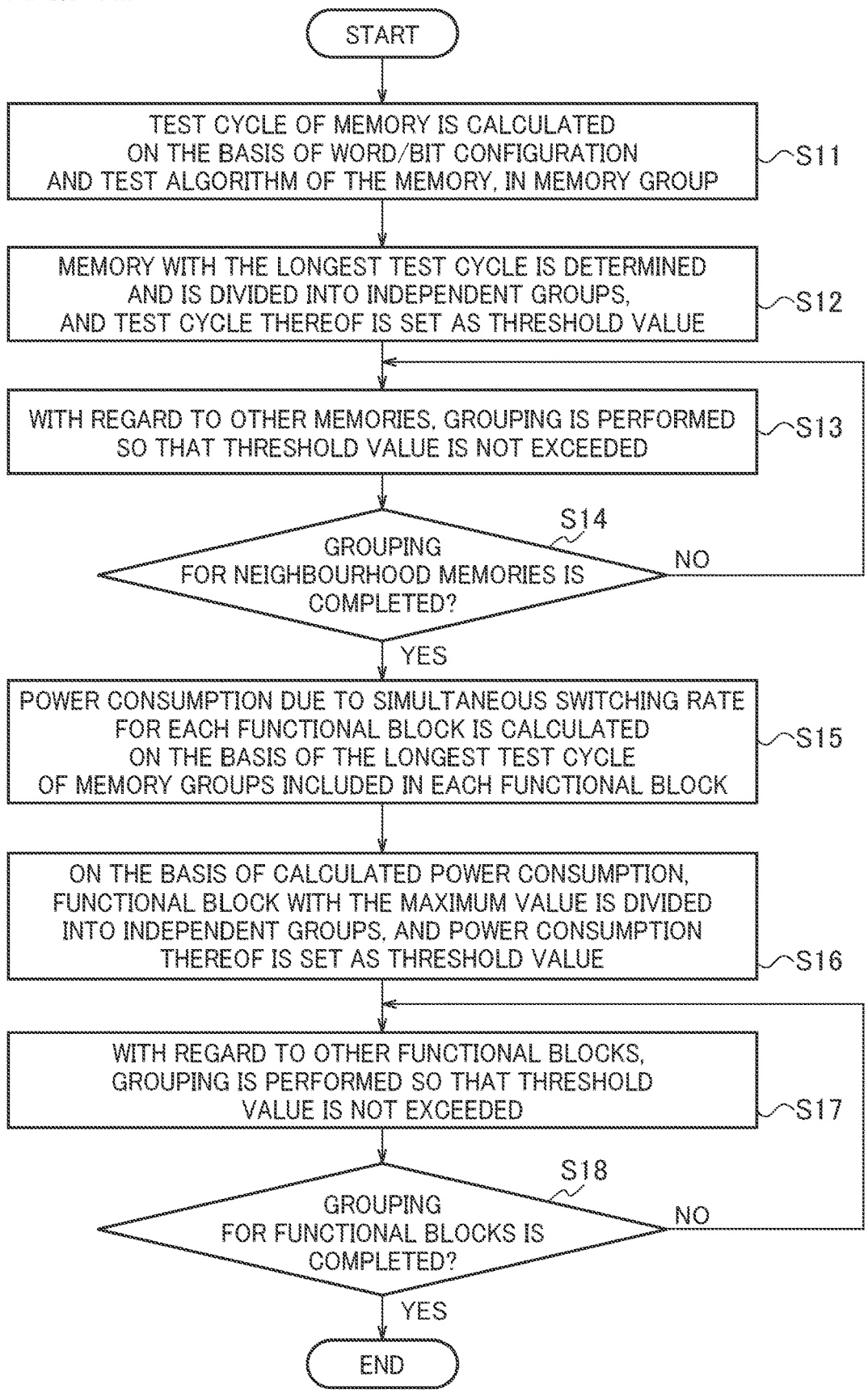
FIG. 12 is a flow chart of memory dividing to be applied to the design support system according to the embodiments.

FIG. 12 is a flow chart of the memory dividing to be applied to the design support system 2 according to the embodiments. With reference to FIG. 12, an operation of the design support system according to the embodiments will now be described.

(A) First, in Step S11, the number of test cycles for memory is calculated in a memory group on the basis of a configuration of the number of words and/or the bit line width and test algorithm of the memory.

(B) Next, in step S12, the memory with the longest number of test cycles is determined and is divided into independent groups, and the number of test cycles is set as a threshold value.

(C) Next, in Step S13, with regard to other memories, grouping is performed so that the threshold value is not exceeded.

(D) Next, in Step S14, it is determined whether or not the grouping is completed in the neighborhood memory. If the determination result is NO, return to Step S13. If the determination result is YES, proceed to Step S15.

(E) Next, in Step S15, power consumption due to simultaneous switching rate of each functional block is calculated on the basis of the longest number of test cycles of the memory group included in each functional block.

(F) Next, in Step S16, on the basis of the calculated power consumption, a functional block with the maximum value is divided into independent groups, and the power consumption thereof is set as a threshold value.

(G) Next, in Step S17, with regard to other functional blocks, grouping is performed so that the threshold value is not exceeded.

(H) Next, in Step S18, it is determined whether or not the grouping is completed in the functional block. If the determination result is NO, return to Step S17. If the determination result is YES, the process of memory dividing is ended.

In the design support system according to the embodiments, the memory grouping is performed in the above-mentioned operation flow chart in cooperation between the memory grouping based on the layout information and the memory grouping based on the number of test cycles. The influence of the number of test cycles can be minimized, the simultaneous switching associated with the memory access can be suppressed, and an increase in the peak power during the test can be avoided.

(Computer Program used for Design Support System)

A computer program used for the design support system includes the following instructions to be executed by a computer. Namely, (1) with respect to a plurality of memories, grouping the plurality of memories into a plurality of blocks on the basis of layout information and functional information of the memories; (2) calculating the number of test cycles required for the test of the plurality of memories on the basis of a configuration of the number of words and/or the bit line width and test algorithms of each of the plurality of memories; (3) setting the maximum number of test cycles for the plurality of memories included in at least one block among the plurality of blocks, as a first threshold value; (4) allocating a memory with the maximum number of test cycles to one subblock, and allocating the remaining memories included in at least one block to other subblocks so as to be within a range equal to or less than the first threshold value; (5) calculating power consumption due to a simultaneous switching rate of each block on the basis of the number of test cycles for the plurality of blocks; (6) on the basis of the power consumption, allocating one of the plurality of blocks having the maximum power consumption to one upper-level block, and setting the maximum power consumption as a second threshold value; and (7) allocating the remaining blocks of the plurality of blocks to the other upper-level blocks so as to be within a range equal to or less than the second threshold value. The computer program used for the design support system is stored in, for example, a non-transitory computer readable medium.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a plurality of memories;
a first control circuit configured to control the plurality of memories; and
a second control circuit capable of controlling at least one memory different from the plurality of memories controlled by the first control circuit,
wherein the first control circuit comprises:
a first state transition circuit configured to execute at least one of write control and read control during an operation of the plurality of memories;
a second state transition circuit connected to the first state transition circuit, the second state transition circuit capable of causing the first state transition circuit to sequentially execute tests of the plurality of memories; and
a clock phase control circuit configured to control a phase of a clock signal of the first control circuit with respect to a phase of the clock signal of the second control circuit.

2. A semiconductor integrated circuit, comprising:
a plurality of memories; and
a first control circuit configured to control the plurality of memories;
wherein the first control circuit comprises:
a first state transition circuit configured to execute at least one of write control and read control during an operation of the plurality of memories; and
a second state transition circuit connected to the first state transition circuit, the second state transition circuit capable of causing the first state transition circuit to sequentially execute tests of the plurality of memories; and
a clock phase control circuit,
wherein the clock phase control circuit comprises a delay logical element configured to shift a phase of a clock signal of the first control circuit with respect to an original clock signal; a phase setting register configured to set a phase difference of the clock signal of the first control circuit with respect to the original clock signal; and a selector configured to select any one of the original clock signal and the clock signal to which the phase difference is set.

3. The semiconductor integrated circuit according to claim 1, wherein
during operation of the plurality of memories corresponds to during tests of the plurality of memories.

4. The semiconductor integrated circuit according to claim 2, wherein
during operation of the plurality of memories corresponds to during tests of the plurality of memories.

5. A semiconductor integrated circuit comprising:
a plurality of functional blocks comprising a plurality of memories, the plurality of memories including at least a first memory, a second memory, and a third memory, the plurality of functional blocks comprising control circuits, the control circuits capable of independently controlling the first memory and the second memory, and the third memory; and
an access circuit connected to the control circuits, the access circuit capable of accessing to the control circuits, wherein
the access circuit is capable of transmitting an enable signal to the control circuits, the enable signal is a signal for starting a control operation of the third memory after the control operation of the first and second memories is completed or for starting the control operation of the first and second memories after the control operation of the third memory is completed,
the access circuit comprises a counter control circuit configured to start the control circuits in accordance with the enable signal, and
the counter control circuit comprises a counter circuit, the counter circuit configured to count the number of pulses of a clock signal supplied thereto after starting of an operation during the operation of one functional block among the plurality of functional blocks, and then to start an operation of a following functional block.

6. The semiconductor integrated circuit according to claim 5, wherein
the counter control circuit comprises a counter setting register configured to count the number of pulses of the clock signal.

* * * * *